United States Patent
Lin et al.

(10) Patent No.: US 7,322,102 B2
(45) Date of Patent: Jan. 29, 2008

(54) ISOTHERMAL PLATE ASSEMBLY WITH PREDETERMINED SHAPE AND METHOD FOR MANUFACTURING THE SAME

(75) Inventors: Kuo-Len Lin, Wugu Township, Taipei County (TW); Hui-Min Tsui, Wugu Township, Taipei County (TW); Ken Hsu, Wugu Township, Taipei County (TW)

(73) Assignee: Cpumate Inc., Taipei (TW)

( * ) Notice: Subject to any disclaimer, the term of this patent is extended or adjusted under 35 U.S.C. 154(b) by 243 days.

(21) Appl. No.: 11/028,652

(22) Filed: Jan. 5, 2005

(65) Prior Publication Data
US 2006/0144571 A1    Jul. 6, 2006

(51) Int. Cl.
  *B23P 6/00*    (2006.01)
  *B21D 53/02*   (2006.01)
(52) U.S. Cl. .............................. 29/890.032; 29/890.03; 165/104.33
(58) Field of Classification Search ............... 29/611, 29/890.03, 890.046, 890.054, 890.039; 165/104.11, 165/104.26, 104.33; 228/183
See application file for complete search history.

(56) References Cited

U.S. PATENT DOCUMENTS

| | | | | |
|---|---|---|---|---|
| 4,212,347 A | * | 7/1980 | Eastman | 165/46 |
| 4,505,419 A | * | 3/1985 | Steeb | 228/183 |
| 5,077,889 A | * | 1/1992 | Matsuda et al. | 29/612 |
| 5,295,302 A | * | 3/1994 | Takai et al. | 29/890.039 |
| 6,131,651 A | * | 10/2000 | Richey, III | 165/185 |
| 6,303,191 B1 | * | 10/2001 | Henne et al. | 427/448 |
| 6,679,318 B2 | * | 1/2004 | Bakke | 165/104.26 |
| 7,114,256 B2 | * | 10/2006 | Liu | 29/890.046 |
| 7,124,507 B1 | * | 10/2006 | Andraka et al. | 29/890.032 |
| 7,146,727 B2 | * | 12/2006 | Kistner et al. | 29/890.039 |

* cited by examiner

*Primary Examiner*—David P. Bryant
*Assistant Examiner*—Alexander P Taousakis

(57) ABSTRACT

An isothermal plate assembly with predetermined shape and method for manufacturing the same are proposed. An upper plate and a lower plate with predetermined shape are provided and an accommodation space is defined therein. A flattened heat pipe is bent into the predetermined shape and placed into the accommodation space. A binding agent is applied on the face between the heat pipe, the upper plate and the lower plate. The upper plate and the lower plate are assembled and then a hot melting process is executed. The resultant product is then cooled to form a finished isothermal plate assembly with predetermined shape.

6 Claims, 6 Drawing Sheets

# ISOTHERMAL PLATE ASSEMBLY WITH PREDETERMINED SHAPE AND METHOD FOR MANUFACTURING THE SAME

BACKGROUND OF THE INVENTION

1. Field of the Invention

The present invention relates to an isothermal plate assembly with predetermined shape and method for manufacturing the same, and more particularly to an isothermal plate assembly with predetermined shape and manufactured by low cost and high yield process.

2. Description of Prior Art

The conventional isothermal plate for heat-dissipating device of electronic apparatus is manufactured by a high thermally conductive material. The thermally conductive material is manufactured into a flat plate with a hollow accommodation space defined therein and containing wicked structure. The isothermal plate further comprises a wavy supporting unit arranged in the hollow accommodation space and used to support walls between an upper plate and a lower plate. The isothermal plate is then filled with working fluid and the accommodation space is sealed.

However, the isothermal plate described in above-mentioned process can only form plate-like structure because the conventional isothermal adopts non-vacuum structure. The conventional isothermal plate has crack problem when it is bent from flat state or its shape is varied due to temperature change. The yield of the conventional isothermal plate is degraded. Furthermore due to the flat shape of the conventional isothermal plate, the electronic apparatus are arranged on one side of the isothermal plate, and the heat-dissipating fins am are arranged on another side of the isothermal plate. The heat-dissipating device is difficult to be made compact and the heat-dissipating effect is influenced.

SUMMARY OF THE INVENTION

The present invention is to provide an isothermal plate assembly with predetermined shape and manufactured by low cost and high yield process, thus meeting requirements of various electronic apparatus.

Accordingly, the present invention provides a manufacturing method for an isothermal plate assembly. An upper plate and a lower plate with predetermined shape are provided and an accommodation space is defined therein. A flattened heat pipe is beat into the predetermined shape and placed into the accommodation space. A binding agent is applied on the face between the heat pipe, the upper plate and the lower plate. The upper plate and the lower plate are assembled and then a hot melting process is executed. The resultant product is then cooled to form a finished isothermal plate assembly with predetermined shape.

Moreover, the present invention provides an isothermal plate assembly with determined shape, which comprises an upper plate, a lower plate opposite to the upper plate and an accommodation space defined between the upper plate and the lower plate. The upper plate and the lower plate are bent into a predetermined shape. A heat pipe is bent to the predetermined shape and placed into the accommodation space.

The above summaries are intended to illustrate exemplary embodiments of the invention, which will be best understood in conjunction with the detailed description to follow, and are not intended to limit the scope of the appended claims.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
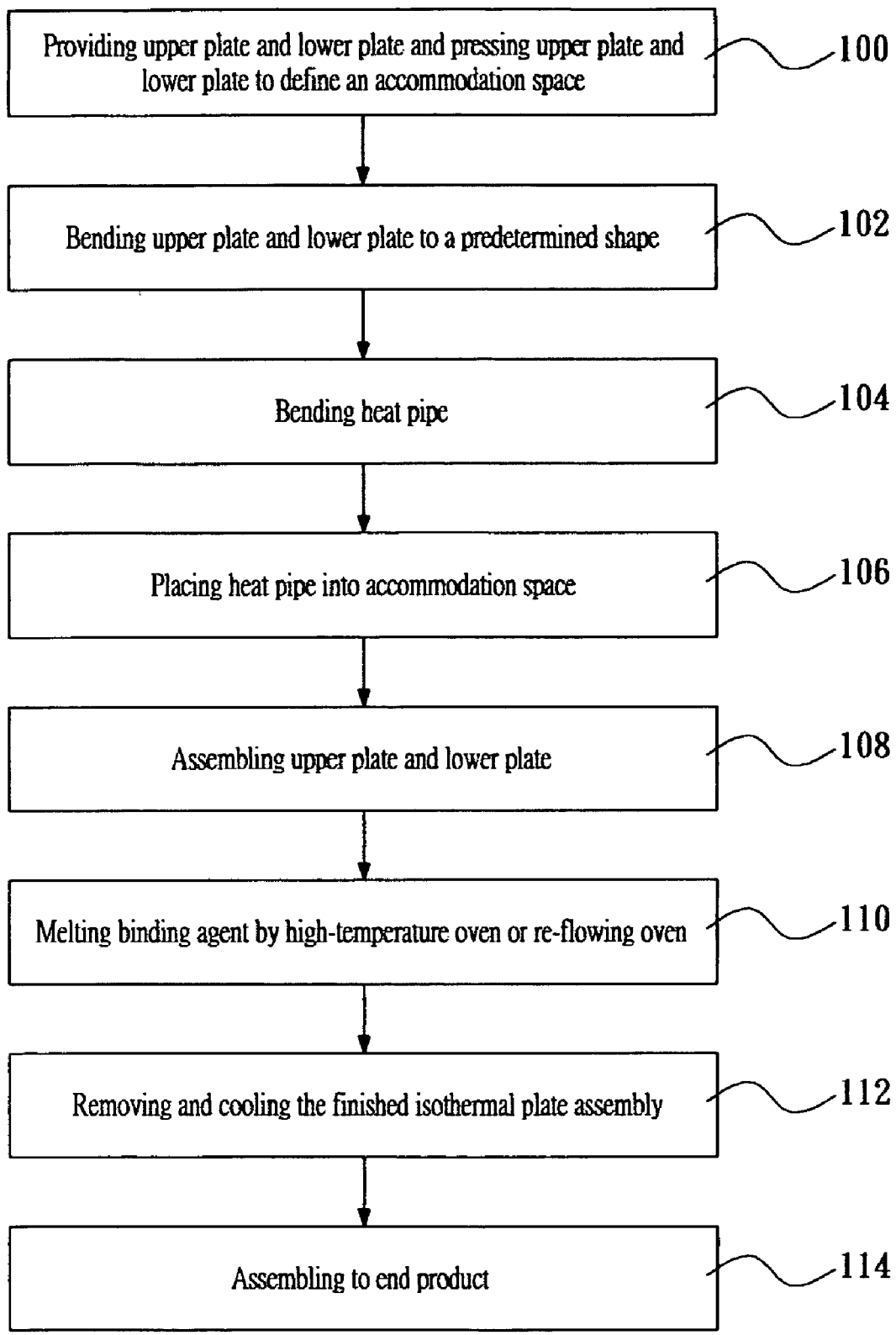
FIG. 1 is a flowchart of method for manufacturing the isothermal plate assembly according to a preferred embodiment of the present invention.
Figure 3:
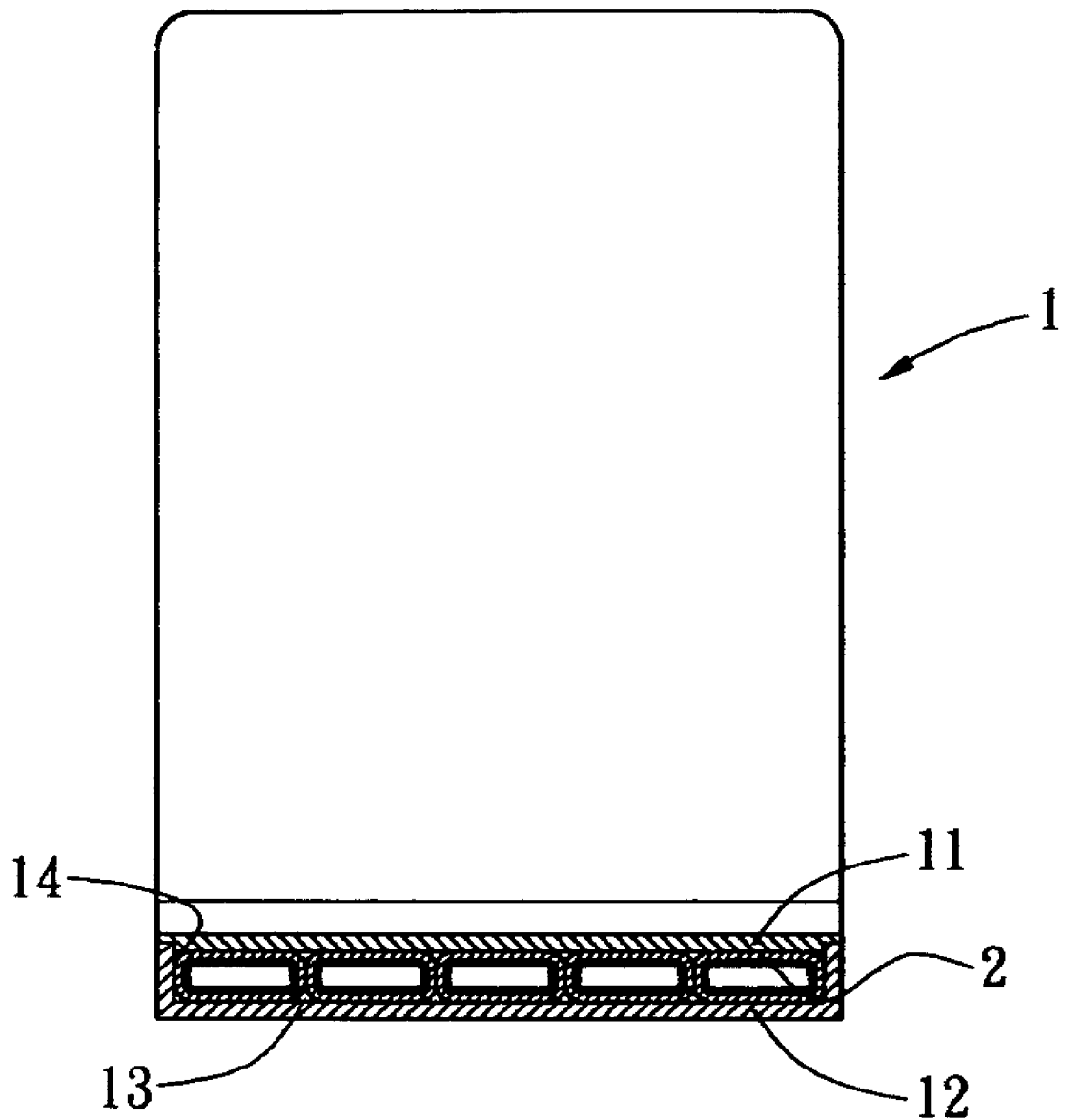
FIG. 3 is a sectional view of the isothermal plate assembly according to a preferred embodiment of the present invention.
Figure 4:
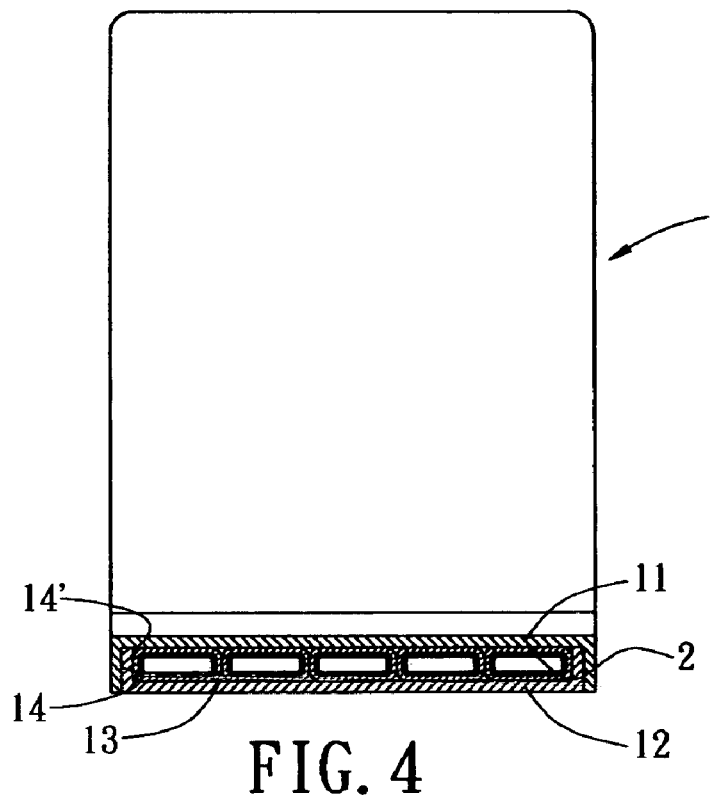
FIG. 4 is a sectional view of the isothermal plate assembly according to another preferred embodiment of the present invention.
Figure 5:
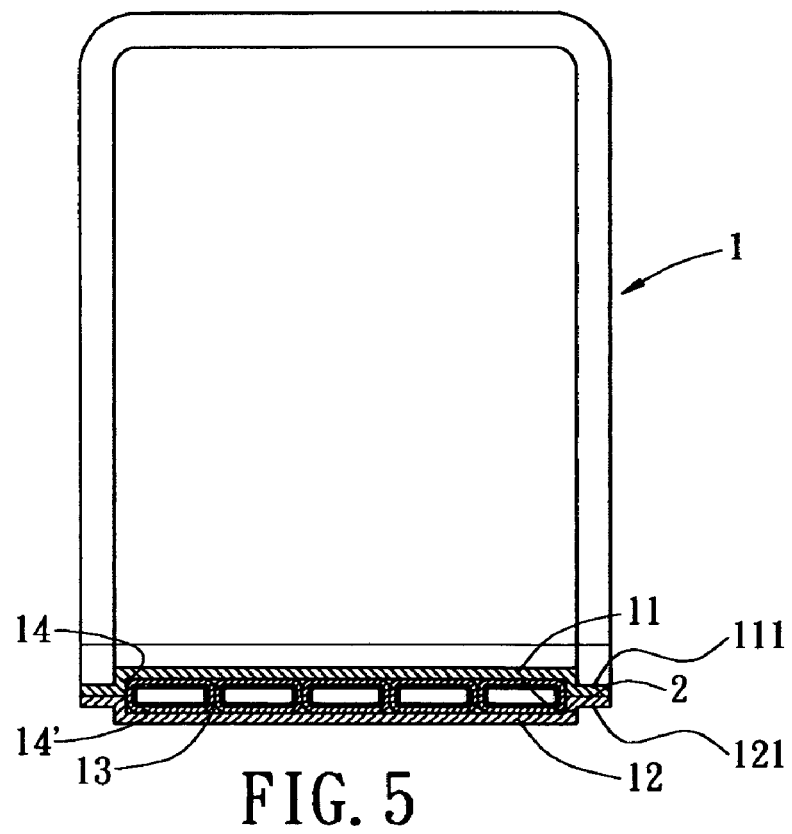
FIG. 5 is a sectional view of the isothermal plate assembly according to still another preferred embodiment of the present invention.

FIG. 1 shows the flowchart of method for manufacturing the isothermal plate assembly 1 according to a preferred embodiment of the present invention, which comprises following steps:

Step 100: Providing an upper plate 11 and a lower plate 12, those plates being assembled to form an isothermal plate assembly 1, pressing on opposite faces of the upper plate 11 and the lower plate 12 to define an accommodation space 13 as shown in FIGS. 3 to 5.

Step 102: Bending the upper plate 11 and the lower plate 12 to a predetermined shape such as L shape shown in FIG. 2, U shape shown in FIG. 6 or S shape shown in FIG. 7.

Figure 2:
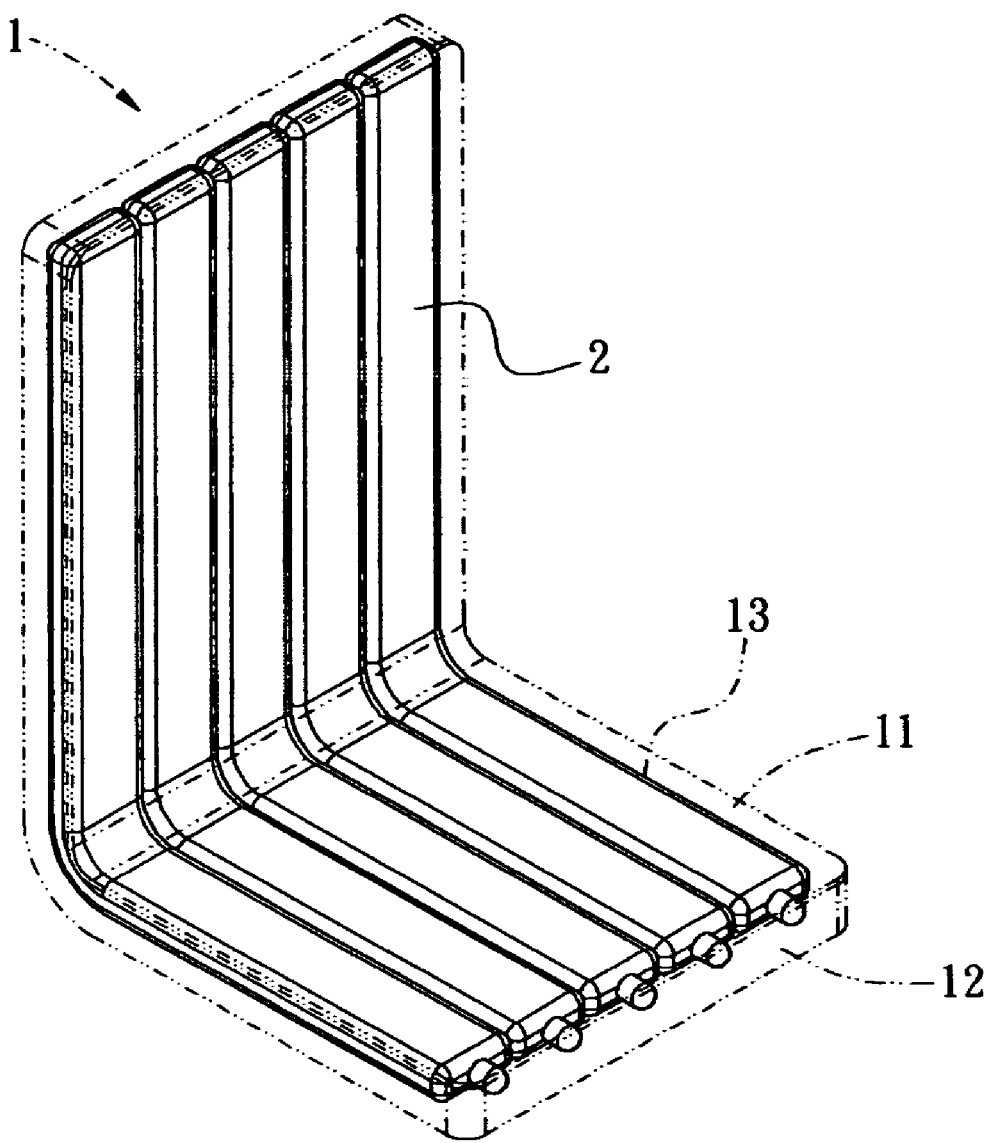
FIG. 2 is a perspective view of the isothermal plate assembly according to a preferred embodiment of the present invention.

Step 104: Providing a flattened flat heat pipe 2 and bending the heat pipe 2 with the shape corresponding to the upper plate 11 and the lower plate 12 as shown in FIG. 2.

Step 106: Placing the heat pipe 2 with bending shape shown in FIG. 2 to the accommodation space 13 and applying binding agent to contact faces between the heat pipe 2 and the upper plate 11 and the lower plate 12. The binding agent is, for example, tin paste or 4450 glue, and could be hot-melted later to fill the gap between the heat pipe 2 and the upper plate 11 and the lower plate 12, and to assemble the heat pipe 2 and the upper plate 11 and the lower plate 12 together, as shown in FIG. 2.

Step 108: Assembling the upper plate 11 and the lower plate 12 together, wherein the heat pipe 2 in the accommodation space 13 is also assembled together, as shown in FIGS. 2 and 4. To enhance the hermetic degree between the upper plate 11 and the lower plate 12, the binding agent is subjected to a following-up thermal-melting process. The upper plate 11 and the lower plate 12 can be assembled by one of riveting, snap locking, embedding, spot-welding, screwing, and glue-pasting step.

Step 110: Sending the assembled upper plate 11 and the lower plate 12 with the heat pipe to a high-temperature oven or a re-flowing oven to melt the binding agent between the heat pipe 2 and the upper plate 11 and the lower plate 12, thus producing a finished isothermal plate assembly.

Step 112: Removing the finished isothermal plate from oven and cooling the finished isothermal plate assembly.

Figure 6:
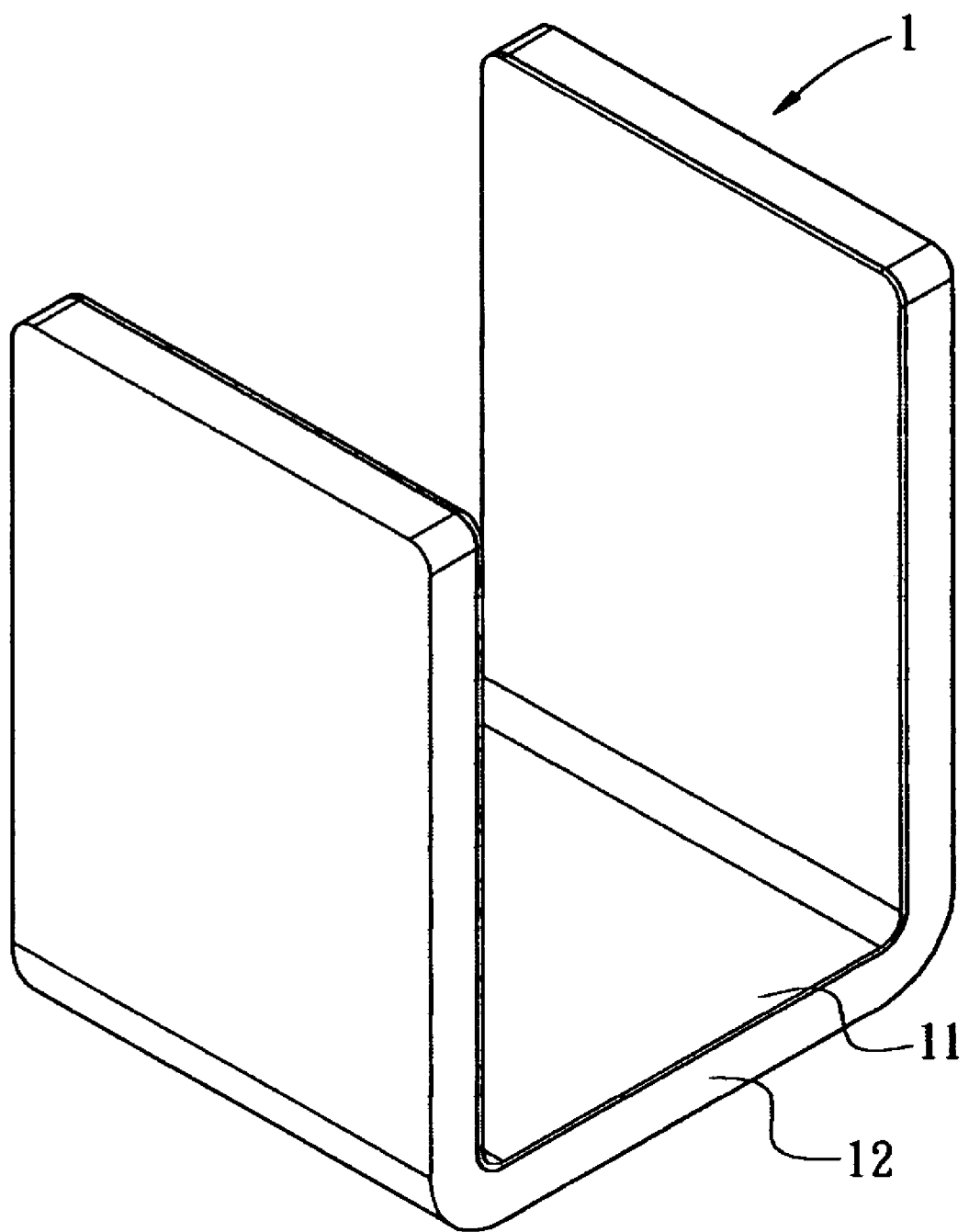
FIG. 6 is a perspective view of the isothermal plate assembly according to another preferred embodiment of the present invention.
Figure 7:
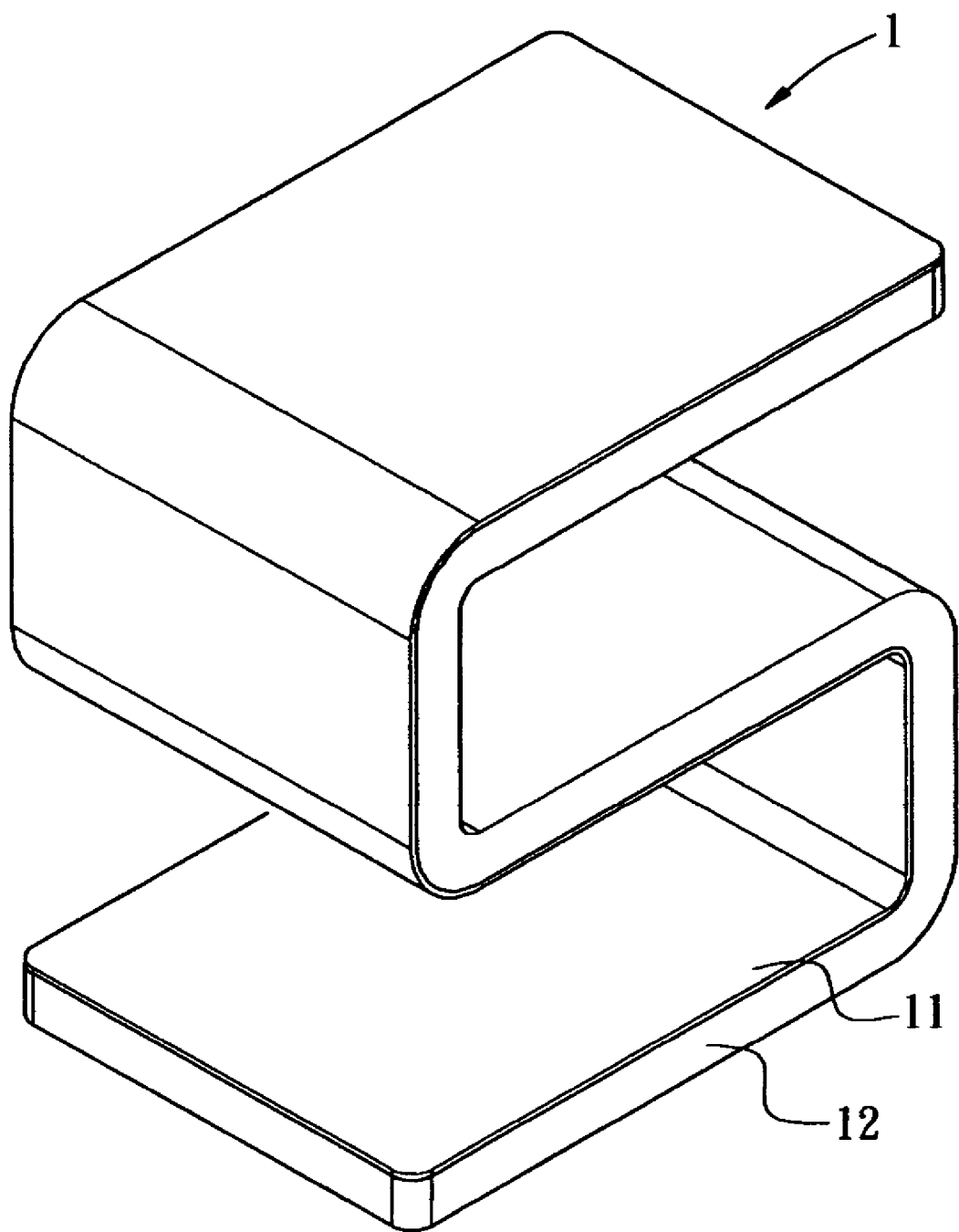
FIG. 7 is a perspective view of the isothermal plate assembly according to still another preferred embodiment of the present invention.

Step 114: The cooled and finished isothermal plates assembly are assembled to end product, as shown in FIGS. 2, 6, and 7.

In above step 106, the heat pipe 2 can be firstly subjected to flatten process and is then bent according to the shape of the upper plate 11 and the lower plate 12.

In above-mentioned process, the isothermal plate assembly can be made with various shapes. The isothermal plate assembly is formed by assembling the upper plate 11 and the lower plate 12. The upper plate 11 and the lower plate 12 are preformed with predetermined bending shape. The heat pipe 2 also has corresponding bending shape and is placed between the upper plate 11 and the lower plate 12 for providing heat conduction Therefore, the isothermal plate with multiple and various shapes can be made with simple and low cost process. The isothermal plate with multiple shapes can be easily adapted with various electronic devices.

The above-mentioned steps 102, 104 and 106 are interchangeable. That is, the heat pipe 2, the upper plate 11 and the lower plate 12 are bent before the heat pipe 2 is placed into the accommodation space 13 formed between the upper plate 11 and the lower plate 12. Alternatively, the heat pipe 2 is firstly placed into the accommodation space 13 formed between the upper plate 11 and the lower plate 12 and then bent together with the upper plate 11 and the lower plate 12. Moreover, a binding agent is selectively applied to contact faces between the heat pipe 2 and the upper plate 11 (and the lower plate 12). The binding agent fills the gap between the heat pipe 2 and the upper plate 11 (and the lower plate 12) by a following-up heating process.

In above-mentioned step 106, the step of applying binding agent to contact faces between the heat pipe 2 and the upper plate 11 (and the lower plate 12) can be eliminated if the hermetic degree between the heat pipe 2 and the upper plate 11 (and the lower plate 12) is sufficient. The step of applying binding agent to contact faces between the upper plate 11 and the lower plate 12 can also be eliminated. In this situation, the end product is manufactured in the step 108, wherein the upper plate 11 and the lower plate 12 are assembled. The high temperature heating process can be eliminated.

With reference to FIGS. 2 to 5, the isothermal plate assembly with multiple shapes comprises an upper plate 11, a lower plate 12 and flattened heat pipe 2 between the upper plate 11 and the lower plate 12.

The upper plate 11 and the lower plate 12 are used form a closed isothermal plate assembly 1 and define an accommodation space 13 therein for receiving the flattened heat pipe 2. In one preferred embodiment, at least one dent 14 is defined on either the upper plate 11 or the lower plate 12. The upper plate 11 or the lower plate 12 with the dent 14 is assembled with the lower plate 12 or the upper plate 11 with smooth face to form an isothermal plate 1 with the accommodation space 13, as shown in FIG. 3.

As shown in FIG. 4, according to other preferred embodiment, both the upper plate 11 and the lower plate 12 are provided with dents 14, 14' to define the accommodation space 13 when the upper plate 11 and the lower plate 12 are assembled together. Moreover, as shown in FIG. 5, the upper plate 11 and the lower plate 12 provided with dent 14, 14' are assembled by the help of outer coupling plates 111 and 121. The accommodation space 13 is defined by the dents provided by the upper plate 11 and the lower plate 12. The upper plate 11 and the lower plate 12 can be subjected to bending operation of other shape before assembling into the isothermal plate 1. The shape is, for example, L shape in FIG. 2, U shape in FIG. 6 or S shape in FIG. 7.

The heat pipe 2 is placed in the accommodation space 13 defined by the dents provided by the upper plate 11 and the lower plate 12 and is functioned to provide heat conduction. The heat pipe 2 is flattened to increase a contact surface between the upper plate 11 and the lower plate 12 and can be bent according to the shape of the upper plate 11 and the lower plate 12. Therefore, the heat pipe 2 has shape corresponding to the shape of the accommodation space 13 between the upper plate 11 and the lower plate 12. The heat pipe 2 can be easily assembled into the accommodation space 13, as shown in FIGS. 2 to 5.

Although the present invention has been described with reference to the preferred embodiment thereof, it will be understood that the invention is not limited to the details thereof Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method for manufacturing an isothermal plate assembly, comprising the sequence of steps as follows:
   a) providing an upper plate and a lower plate with an accommodation space defined therein;
   b) bending the upper plate and the lower plate to a predetermined shape;
   c) providing a flattened heat pipe and bending the heat pipe to the predetermined shape;
   d) placing a plurality of the bent heat pipes into the accommodation space and assembling the upper plate and the lower plate; and
   e) performing a hot-melting process to seal the upper plate and the lower plate and then cooling the upper plate and the lower plate to form an isothermal plate assembly with predetermined shape.

2. The method for manufacturing an isothermal plate assembly as in claim 1, wherein the predetermined shape includes one of L shape, U shape, and S shape.

3. The method for manufacturing an isothermal plate assembly as in claim 1, further comprising the step of:
   applying a binding agent on a contact face between the heat pipe and the upper plate and the lower plate, and another contact face between the upper plate and the lower plate, the binding agent being melted in the hot-melting process to seal a gap between the heat pipe and the upper plate and the lower plate.

4. The method for manufacturing an isothermal plate assembly as in claim 1, further comprising the step of:
   assembling the upper plate and the lower plate by one of riveting, snap locking, embedding, spot-welding, screwing, and glue-pasting step, and selectively applying a binding agent on a contact face between the upper plate and the lower plate.

5. The method for manufacturing an isothermal plate assembly as in claim 1, further comprising the step of:

after assembling the upper plate and the lower plate, sending the assembled upper plate and lower plate to one of high temperature oven and re-flowing oven for a hot melting process; and cooling the assembled upper plate and lower plate.

6. A method for manufacturing an isothermal plate assembly, comprising a sequence of steps as follows:

a) providing an upper plate and a lower plate with an accommodation space defined therein;

b) bending the upper plate and the lower plate to a predetermined shape;

c) providing a flattened heat pipe and bending the heat pipe to the predetermined shape; and d) placing a plurality of the bent heat pipes into the accommodation space and assembling the upper plate and the lower plate.

* * * * *